(12) United States Patent
Hekmatshoartabari et al.

(10) Patent No.: US 10,090,415 B1
(45) Date of Patent: Oct. 2, 2018

(54) THIN FILM TRANSISTORS WITH EPITAXIAL SOURCE/DRAIN CONTACT REGIONS

(71) Applicant: INTERNATIONAL BUSINESS MACHINES CORPORATION, Armonk, NY (US)

(72) Inventors: Bahman Hekmatshoartabari, White Plains, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/825,656

(22) Filed: Nov. 29, 2017

(51) Int. Cl.
*H01L 29/786* (2006.01)
*H01L 21/02* (2006.01)
*B82Y 40/00* (2011.01)
*B82Y 99/00* (2011.01)

(52) U.S. Cl.
CPC .... *H01L 29/78621* (2013.01); *H01L 21/0257* (2013.01); *B82Y 40/00* (2013.01); *B82Y 99/00* (2013.01)

(58) Field of Classification Search
CPC ................................................ H01L 29/78621
See application file for complete search history.

(56) References Cited

U.S. PATENT DOCUMENTS

| | | | |
|---|---|---|---|
| 5,943,560 | A | 8/1999 | Chang et al. |
| 6,593,624 | B2 | 7/2003 | Walker |
| 7,122,449 | B2 | 10/2006 | Langdo et al. |
| 7,306,980 | B2 | 12/2007 | Takehashi et al. |
| 8,809,168 | B2 | 8/2014 | Bedell et al. |
| 2004/0234781 | A1 | 11/2004 | Herner et al. |
| 2004/0266075 | A1 | 12/2004 | Chen |
| 2012/0210932 | A1 | 8/2012 | Hekmatshoar-Tabari et al. |
| 2016/0254389 | A1 | 9/2016 | Lu et al. |
| 2016/0343830 | A1 | 11/2016 | Li et al. |

FOREIGN PATENT DOCUMENTS

CN 103730364 A 4/2014

OTHER PUBLICATIONS

Chang, K-M et al., "High-Performance RSD Poly-Si TFTs With a New ONO Gate Dielectric" IEEE Transactions on Electron Devices (Jun. 2004) pp. 995-1001, vol. 51, No. 6.

Di Gaspare, A. et al., "Stable p-channel polysilicon thin film transistors fabricated by laser doping technique" Thin Solid Films (Apr. 2005) pp. 232-236, vol. 487.

(Continued)

*Primary Examiner* — Douglas Menz
(74) *Attorney, Agent, or Firm* — Tutunjian & Bitetto, P.C.; Louis J. Percello

(57) ABSTRACT

A method of forming a thin film transistor (TFT) that includes forming a low temperature polysilicon semiconductor layer on a substrate; and implanting first dopant regions on opposing sides of a channel region of the low temperature polysilicon semiconductor layer. The method may further include epitaxially forming second dopant regions on the first dopant regions. The concentration of the conductivity type dopant in the second dopant regions is greater than a concentration of the conductivity type dopant in the first dopant region. The second dopant regions are formed using a low temperature epitaxial deposition process at a temperature less than 350° C.

20 Claims, 4 Drawing Sheets

(56) References Cited

OTHER PUBLICATIONS

Baumgart, H. et al., "Grain Boundary Diffusion in Polycrystalline Silicon Films on SiO2" Journal De Physique (Oct. 1982) pp. C1-363-C1-368, Colloque C1, Supplement 10:43.

Nishimura, T. et al., "Evaluation and Control of Grain Boundaries in Laser-Recrystallized Polysilicon Islands for Device Fabrication" Japanese Journal of Applied Physics (Jan. 1983) pp. 217-221, vol. 22.

Pichon, L. et al., "Low temperature (< 600°C.) unhydrogenated in-situ doped polysilicon thin film transistors: Towards a technology for flat panel displays" Thin Solid Films (Mar. 1997) pp. 133-136, vol. 296.

Shahrjerdi, D. et al., "Low-Temperature Epitaxy of Compressively Strained Silicon Directly on Silicon Substrates" Journal of Electronic Materials (Nov. 2012) pp. 494-497, vol. 41, No. 3.

Ng, K.K. et al., "Effects of Grain Boundaries on Laser Crystallized Poly-Si MOSFET's" IEEE Electron Device Letters (Dec. 1981) pp. 316-318, vol. EDL-2, No. 12.

Herbst, L. et al., "Excimer Laser Advances Enable High-Performance Flat Panel Displays" Photonics Spectra (Aug. 2006) https://www.photonic.com/Article.aspx?AID=26317, Accessed on Nov. 3, 2017, pp. 1-6.

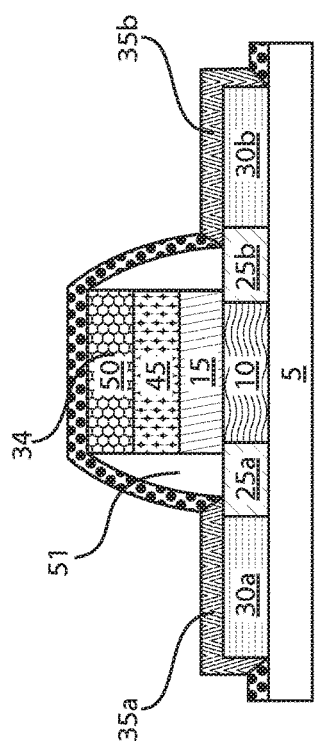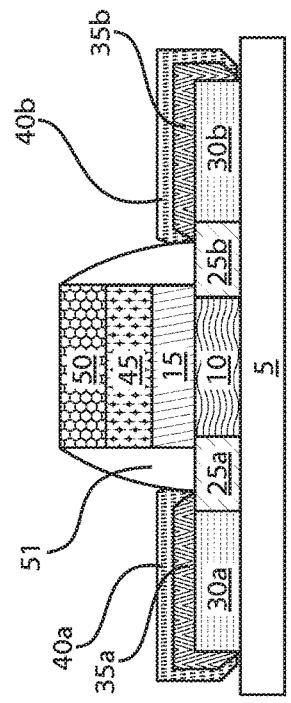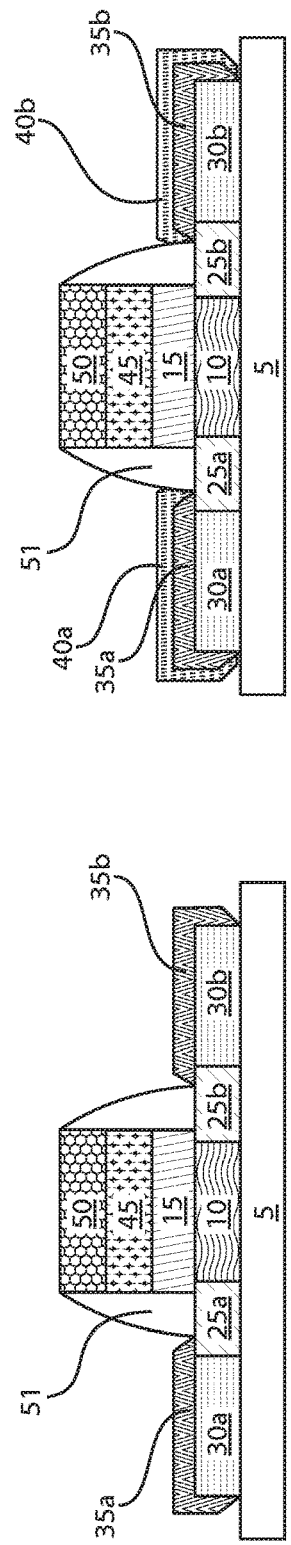

THIN FILM TRANSISTORS WITH EPITAXIAL SOURCE/DRAIN CONTACT REGIONS

BACKGROUND

Technical Field

The present invention generally relates to semiconductor devices, and more particularly to thin film transistor (TFT) type semiconductor devices.

Description of the Related Art

A thin-film transistor (TFT) are a kind of field-effect transistor made by depositing thin films of an active semiconductor layer as well as the dielectric layer and metallic contacts over a supporting (but non-conducting) substrate. A common substrate is glass, which is suitable for one application of TFTs, which is in liquid-crystal displays. This differs from the metal oxide semiconductor field effect (MOSFET) transistor, where the semiconductor material typically is the substrate, such as a silicon wafer. TFTs can be made using a wide variety of semiconductor materials.

SUMMARY

In accordance with one aspect, the methods and structures of the present disclosure employ a low-temperature epitaxial growth of highly-doped hydrogenated crystalline silicon (c-Si:H) to form at least the highly doped source and drain contact regions of the device, in a manner that reduces dopant diffusion from the source and drain regions.

In one embodiment, a thin-film transistor (TFT) is provided that includes a semiconductor region of polycrystalline semiconductor material, such as polysilicon, present on an insulating substrate; and a first concentration doped source/drain region formed within the semiconductor region on opposing sides of a channel region within the semiconductor region. In some embodiments, the polycrystalline semiconductor material may be low temperature polysilicon (LTPS). Epitaxial hydrogenated crystalline silicon (c-Si:H) source/drain regions having a second concentration dopant are present on the first concentration doped source/drain region. The second concentration dopant of the epitaxial hydrogenated crystalline silicon (c-Si:H) source/drain regions is greater than a concentration of the first concentration doped source/drain region. In one embodiment, a thickness of the polycrystalline semiconductor region is no greater than 100 nm.

In another embodiment, a thin-film transistor (TFT) is provided that includes a semiconductor region of polycrystalline semiconductor material present on an insulating substrate having a thickness of 100 nm or less. In some embodiments, the polycrystalline semiconductor material may be low temperature polysilicon (LTPS). A first concentration doped source/drain region formed within the semiconductor region is present on opposing sides of a channel region within the semiconductor region. Epitaxial hydrogenated crystalline silicon (c-Si:H) source/drain regions having a second concentration dopant are present on the first concentration doped source/drain region. The second concentration dopant of the epitaxial hydrogenated crystalline silicon (c-Si:H) source/drain regions is greater than a concentration of the first concentration doped source/drain region. A gate structure present on the channel portion of the semiconductor region. Spacers are present on sidewalls of the gate structure.

In another aspect of the present disclosure, a method of forming a thin film transistor (TFT) is provided that includes forming a polycrystalline semiconductor layer, such as polysilicon, on a substrate; and implanting first dopant regions on opposing sides of a channel region of the polycrystalline semiconductor layer. The method may further include epitaxially forming second dopant regions on the first dopant regions. The concentration of the conductivity type dopant in the second dopant regions is greater than a concentration of the conductivity type dopant in the first dopant region. The second dopant regions are formed using a low temperature epitaxial deposition process at a temperature less than 350° C. In some embodiments, the polycrystalline semiconductor material that provides the channel region of the device may be low temperature polysilicon (LTPS).

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 12 is a side cross-sectional view depicting one step of a low temperature epitaxial deposition process for forming an in situ doped epitaxial semiconductor material on the source and drain regions of the TFT device depicted in FIG. 11, wherein a concentration of the dopant in the in situ doped epitaxial semiconductor material is greater than the concentration of dopant in the portions of the source and drain region that are formed using ion implantation, in accordance with one embodiment of the present disclosure.

FIG. 13 is a side cross-sectional view depicting a second step of the low temperature epitaxial deposition process for forming the in situ doped epitaxial semiconductor material applied to the structure depicted in FIG. 12, in which amorphous semiconductor material that is formed on dielectric structures is removed selectively to epitaxial semiconductor material that is formed atop semiconductor material, in accordance with one embodiment of the present disclosure.

FIG. 14 is a side cross-sectional view depicting forming contacts to the in situ doped epitaxial semiconductor material of the source and drain regions of the TFT device depicted in FIG. 13, in accordance with one embodiment of the present disclosure.

DETAILED DESCRIPTION

Figure 2:
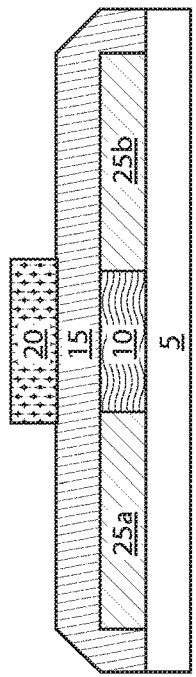
FIG. 2 is a side cross-sectional view depicting forming source and drain regions having a first concentration on opposing sides of the channel region of the LTPS layer using ion implantation, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structure described herein provide thin film transistors (TFTs). A thin-film transistor (TFT) is a kind of field-effect transistor (FET) made by depositing of an active semiconductor layer as well as the dielectric layer and metallic contacts over a supporting substrate. The supporting substrate may be composed of a non-conductive material, e.g., an insulator. A common substrate for a TFT device is glass, because the primary application of TFTs is in liquid-crystal displays. This differs from the conventional transistor, where the semiconductor material typically is the substrate, such as a silicon wafer. TFTs can be made using a wide variety of semiconductor materials.

Amorphous silicon TFTs have been widely used in liquid crystalline display (LCD) flat panels because of their low cost and suitability for large area deposition. However, amorphous Si TFTs suffer from low mobility and poor device stability that precludes high display resolutions and monolithic integration of the driver circuitry on the display backplane. The evolution to low temperature polycrystalline silicon thin film transistors (LTPS-TFTs) can have many benefits such as higher device performance and better device stability that enables higher display resolution (i.e. pixels per inch), and monolithic integration of the driver circuitry. XeCl Excimer-Laser Annealing (ELA) is one method to produce polycrystalline silicon (p-Si) by melting an amorphous (a-Si) material through laser irradiation, and is currently the dominant technology used in manufacturing of display panels for cell phones and other portable devices.

Xenon monochloride (XeCl)-excimer laser annealing (ELA) succeeds in crystallizing amorphous silicon ($\alpha$-Si) for thicknesses ranging from 500 Å to 10,000 Å into polycrystalline silicon (p-Si) without substantial heating the substrates. This is because laser pulses with short durations generate local heat which may be efficiently dissipated, allowing to maintain the substrate at temperatures as low as room temperature (or even lower if substrate cooling is used). The polycrystalline form has larger grains that yield better mobility for TFTs due to reduced scattering from grain boundaries. This technique leads to the successful integration of complicated circuits in LCD displays.

Low-temperature poly-Si (LTPS) thin-film transistors (TFTs) employ high voltages for driving liquid crystal displays (LCDs) and electrophoretic displays at levels ranging from 8V to 10V, and 20V to 30V, respectively. Such high voltages require drain-field relief structures, such as lightly-doped drain (LDD) regions. Conventionally, both the lightly-doped drain (LDD) regions and the highly-doped source/drain contact regions are formed by ion-implantation (or ion-shower), followed by doping activation that may include a combination of laser treatment and thermal annealing. Given the temperature limitations of the glass substrates, it has been determined that the activation of dopants is particularly challenging at high doping levels used for the source/drain contact regions, which can be close to the solid solubility limit of the material in which the dopant is being introduced. Additionally, fast diffusion of dopants along grain boundaries can reduce the effective lengths of the lightly-doped drain (LDD) regions (or eliminate), and induce non-uniformity (given the spatial variation of the grain boundaries). As a result, there can be a trade-off between low series resistance, and effective lightly-doped drain (LDD) regions/uniform device characteristics. Further, it has been determined that overall the conventional activation process is expensive and complicated.

In some embodiments, the methods and structures of the present disclosure employ a low-temperature epitaxial growth of highly-doped hydrogenated crystalline silicon (c-Si:H) to form at least the highly doped source and drain contact regions of the device, in a manner that reduces dopant diffusion when compared to conventional processing. The highly-doped hydrogenated crystalline silicon (c-Si:H) provided by in-situ doped epitaxial semiconductor may replace or complement the doped source/drain contact regions that are formed by ion implantation. The disclosed devices may further include low-temperature self-aligned silicide at the source and drain regions to further reduce contact resistance and/or facilitate self-aligned device structures. The low-temperature epitaxial growth may be performed using plasma-enhanced chemical vapor deposition (PECVD) at temperatures below 450° C. In some embodiments, the plasma enhanced chemical vapor deposition (PECVD) may range from 150° C. to 350° C. While the methods and structures disclosed herein are particularly of interest to low-temperature polysilicon (LTPS) thin-film transistors, it will be appreciated that the substrate material is not limited to LTPS. For example, the substrate may include low-temperature polycrystalline silicon-germanium or high-temperature polysilicon. The methods and structures of the present disclosure are now described with greater detail with reference to FIGS. 1-14.

Figure 1:
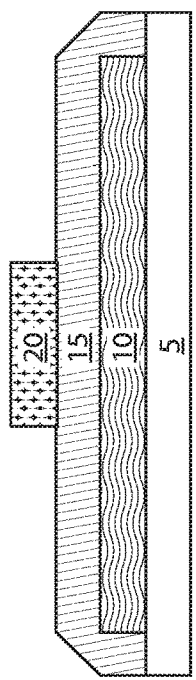
FIG. 1 is a side cross-sectional view depicting one embodiment of an initial structure for forming a thin film transistor (TFT) that includes a low temperature polysilicon semiconductor (LTPS) layer on a dielectric substrate, a dielectric layer overlying the LTPS layer, and a gate structure overlying a channel region portions of the LTPS layer, in accordance with one embodiment of the present disclosure.

FIG. 1 depicts one embodiment of an initial structure for forming a thin film transistor (TFT) that includes a low temperature polysilicon semiconductor (LTPS) layer 10 on a dielectric substrate 5. In some embodiments, a dielectric layer 15 is present overlying the LTPS layer 10. FIG. 1 also depicts a gate structure 20 (also referred to as gate electrode material) overlying a channel region portions of the LTPS layer 10.

The term "low-temperature polycrystalline silicon (LTPS)" is polycrystalline silicon that has been synthesized at relatively low substrate temperatures, e.g., at temperatures of ~650° C. and lower, compared to conventional methods for forming polysilicon crystalline, which are at substrate temperatures above 900° C. Polycrystalline silicon, also called polysilicon or poly-Si, is a high purity, polycrystalline form of silicon. In single crystal silicon, also known as monocrystalline silicon, the crystalline framework is homogenous. The entire sample is one single, continuous and unbroken crystal as its structure contains no grain boundaries. In contrast, in an amorphous structure the order in atomic positions is limited to short range. Polycrystalline and paracrystalline phases are composed of a number of smaller crystals or crystallites. Polycrystalline silicon (or semi-crystalline silicon, polysilicon, poly-Si, or simply "poly") is a material consisting of multiple small silicon crystals.

FIG. 1 depicts one embodiment of an initial structure for forming a thin film transistor (TFT) that includes a low temperature polysilicon semiconductor (LTPS) layer 10 on a dielectric substrate 5. In some embodiments, the dielectric substrate 5 includes at least one of a silicon oxide layer, e.g., $SiO_2$ layer, and/or a nitride layer. e.g., silicon nitride layer. The dielectric substrate may include a supporting substrate composed of a glass composition.

The low temperature polysilicon semiconductor (LTPS) layer 10 may be formed on the dielectric substrate 5 using a chemical vapor deposition (CVD) process that employs gas precursors that can include silane, phosphine and hydrogen, which are used in the present embodiment, are $SiH_4$, $PH_3$ and $H_2$, respectively. These gases can be used as the gas to deposit the LTPS layer 10. However, the material can further include other compositions. In addition, the mass ratio of silane, phosphine and hydrogen in the material gas can be adjusted according to the process requirements.

In some embodiments, forming the low temperature polysilicon semiconductor (LTPS) layer 10 may include depositing an amorphous silicon (a-Si) layer, and performing a laser annealing process to convert the amorphous silicon (a-Si) layer to polysilicon. The a-Si layer may be deposited, e.g. using a plasma-enhanced chemical vapor deposition (PECVD) process that employs gas precursors that can include silane, phosphine and hydrogen, which are used in the present embodiment, are $SiH_4$, $PH_3$ and $H_2$, respectively. However, the material can further include other compositions. In addition, the mass ratio of silane, phosphine and hydrogen in the material gas can be adjusted according to the process requirements. The a-Si layer may be dehydrogenated prior to laser crystallization using a furnace anneal or low-energy laser treatment to avoid explosive release of hydrogen during melting. Alternatively, a-Si may be grown using a physical vapor deposition (PVD) technique such as sputtering, e.g. from a phosphorus doped solid (sintered) silicon target. Other deposition techniques such as evaporation may also be used.

In some embodiments, the aforementioned process can provide an amorphous silicon layer, e.g., a hydrogenated amorphous silicon thin film (a-Si:H), having a thickness ranging from about 5 nm to about 100 nm. In some other embodiments, the thickness of the amorphous silicon (a-Si) layer may range from 25 nm to 75 nm. It is noted that the aforementioned example for forming the amorphous silicon layer, is only one example, and the present disclosure is not intended to be limited to only this example. For example, in addition to radio frequency plasma enhanced chemical vapor deposition (RF-PECVD), the amorphous silicon layer may also be formed using any type of chemical vapor deposition, e.g., metal organic chemical vapor deposition. In yet another embodiment, the a-Si thickness is 50 nm.

Still referring to FIG. 1, the amorphous silicon layer may then be converted to a polycrystalline crystal structure using a low temperature process, such as laser annealing. In some embodiments, the laser annealing process is carried out to melt the amorphous silicon film and permit the melt silicon to re-crystallize into a polysilicon film. As explained earlier, while a-Si is melted by laser, the generated heat is local and may be effectively dissipated, thus maintaining the substrate at low temperatures. In one embodiment, the annealing process may be carried out with an excimer laser. In this technique, a pulsed excimer laser line beam is scanned over the a-Si film. Silicon efficiently absorbs the 308 nm excimer output. This absorption, combined with the pulse energy of the excimer laser, provides a near-complete melt of the thin silicon layer. In one example, the excimer laser energy density (fluence) is in the range of 350-450 mJ/$cm^2$, the laser pulse width is in the range of 10-50 ns and the repetition rate is in the range of 100 Hz-1 KHz. The number of laser pulses (shots) may be in range of 1-100, but a larger number of pulses may also be used. Other techniques known in the art, such as sequential lateral solidification (SLC) which typically results in complete melting of a-Si (rather than near-complete melting) may also be used.

Following the rapid cooling and solidification of the melted amorphous silicon layer, the layer has been converted to polysilicon. Because the polysilicon was converted from an amorphous silicon material at low substrate temperatures, the polysilicon may be referred to as "low temperature polysilicon (LTPS)". The laser treatment may produce a rough surface including protrusions at the locations of the grain boundaries. An optional surface planarization step, using techniques known in the art, such as chemical-mechanical polishing (CMP) may be used to substantially reduce the surface roughness of LTPS.

The low temperature polysilicon layer 10 can be patterned and etched to define the dimensions extending from the end of one of the source/drain regions, e.g., the source region, across the channel region to the second of the source/drain regions, e.g., the drain region. This may be referred to as the active device region, and patterning may be performed by lithography and etching. Lithography includes forming a photoresist material (not shown) on an exposed surface of the blanket low temperature polysilicon layer 10, exposing the photoresist material to a desired pattern of radiation, and developing the photoresist material utilizing a conventional resist developer. The etching step, which transfers the pattern from the patterned photoresist into the blanket layer of crystalline semiconductor material, e.g., LTPS layer 10, can include dry etching (i.e., reactive ion etching, ion beam etching, or plasma etching), wet chemical etching, or a combination thereof. After pattern transfer, the patterned photoresist is removed from the structure utilizing a stripping process such as, for example, chemical stripping, ashing and/or selective etching.

Referring to FIG. 1, a dielectric layer 15 may be blanket deposited to cover the low temperature polysilicon (LTPS) 10 layer. The dielectric layer 15 may be composed of any oxide, nitride and/or oxynitride. For example, the dielectric layer 15 may be composed of silicon nitride and/or silicon oxide. The dielectric layer 15 may be formed using a deposition process, such as chemical vapor deposition (CVD). Examples of CVD suitable for forming the dielectric layer 15 include plasma enhanced chemical vapor deposition (PECVD). The thickness of the dielectric layer may range from 2 nm to 100 nm. In another embodiment, the thickness of the dielectric layer ranges from 5 nm to 15 nm.

Referring to FIG. 1, an electrode material 20 (also referred to as gate structure) can be formed on an uppermost surface of the layer of the dielectric layer 15. The electrode material 20 can be comprised of a conductive material including, for example, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cr, Cu, W, Pt, Al, Pd, Ru, Ni, and Ir. The electrode portion 20 can have a thickness from 1 nm to 1000 nm. Other thicknesses that are lesser than, or greater than, the aforementioned thickness range can also be employed as the thickness for the electrode portion 20.

In some embodiments, the electrode portion 20 can be formed using a deposition process including, for example, chemical vapor deposition, plasma enhanced chemical vapor deposition, sputtering, chemical solution deposition, or plating. In some embodiments, the conductive material can be patterned by lithography and etching. The etch or etches that can be used in this embodiment of the present disclosure may include for example, a dry etch process such as, for example, reactive ion etching, plasma etching or ion beam etching. Alternatively, a chemical wet etch can be employed.

FIG. 2 depicts forming source and drain regions 25a, 25b having a first concentration on opposing sides of the channel region of the LTPS layer 10 using ion implantation. Ion implantation is a materials engineering process by which ions of a material are accelerated in an electrical field and impacted into a solid, hence providing implantation of the ion into the solid it impacts. Ion implantation equipment typically consists of an ion source, where ions of the desired element are produced, an accelerator, where the ions are electrostatically accelerated to a high energy, and a target chamber, where the ions impinge on a target, which is the material to be implanted.

As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. Because the source region and the drain region are both provided by doped regions on opposing sides of the channel of the device, and their function as a source region or a drain region is impacted by the bias applied to these regions in the final device structure, the term source/drain region is suitable for describing these doped regions in the absence of the bias that designates their type.

In this step, the electrode material 20 functions as an implant mask, and the exposed portions of the LTPS layer 10 are implanted to form the source and drain regions 25a, 25b. In some embodiments, the source and drain regions 25a, 25b having a first concentration may be doped to an an-type conductivity, i.e., are doped with an n-type dopant. As used herein, "n-type" refers to the addition of impurities that contributes free electrons to an intrinsic semiconductor. The n-type conductivity semiconductor devices are typically produced within silicon containing substrates by doping the source and drain regions 25a, 25b with elements from group V-A of the Periodic Table of Elements. In a silicon containing substrate, examples of n-type dopants, i.e., impurities, include but are not limited to, antimony, arsenic and phosphorous.

To achieve a given doping profile, a single or multiple implantation steps may be used. The implanted dopants may be activated using thermal annealing, e.g. at temperatures in the range of 450-650° C. low-energy laser anneal, or a combination thereof.

In one embodiment, the n-type dopant is implanted into the source and drain regions 25a, 25b to provide a total doping concentration for the first concentration doped source/drain region that ranges from $5 \times 10^{17}$ cm$^{-3}$ to $1 \times 10^{19}$ cm$^{-3}$. In some embodiments, the activated doping concentration of the first concentration doped source/drain region ranges from $10^{18}$ cm$^{-3}$ to $5 \times 10^{18}$ cm$^{-3}$. The activated dopant concentration is the concentration of dopants that contributes to the electrical performance, e.g., sheet resistance, of the doped region.

In some embodiments, the first concentration doped source/drain region 25a, 25b may also be doped to a p-type conductivity. As used herein, "p-type" refers to the addition of impurities to an intrinsic semiconductor that creates deficiencies of valence electrons. The p-type conductivity semiconductor devices 100b are typically produced within silicon containing substrates by doping the source and drain regions with elements from group III-A of the Periodic Table of Elements. In a silicon containing substrate, examples of p-type dopants, i.e., impurities, include but are not limited to boron, aluminum, gallium and indium.

In some embodiments, a photoresist mask may be used as an implantation mask instead of the electrode material 20. After implantation, the photoresist mask may be removed, followed by dopant activation and formation of the electrode material 20. This process sequence allows use of electrode materials that do not withstand the dopant activation process, in one or more embodiments.

In some embodiments, the source region 25a and the drain region 25b having the first concentration provides a source/drain extension region, which also may be referred to as a lightly doped drain (LDD) region.

Figure 3:
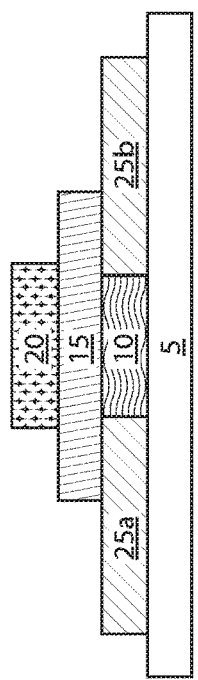
FIG. 3 is a side cross-sectional view depicting patterning the dielectric layer that is present over the LTPS layer.

FIG. 3 depicting patterning the dielectric layer 15 that is present over the LTPS layer 10. The dielectric layer 15 may be patterned and etched to remove the portions of the dielectric layer 15 that are overlying portions of the source region 25a and the drain region 25b, in which intermediately doped source/drain regions 30a, 30b are formed, as depicted in FIG. 4, which can have a total doping concentration ranging from $5 \times 10^{18}$ cm$^{-3}$ to $10^{20}$ cm$^{-3}$.

Referring to FIG. 3, the dielectric layer 15 may be patterned using photolithography, in which a photoresist mask is formed over the portion of the dielectric layer 15 that is to remain, and the exposed portions of the dielectric layer 15 that are not underlying the photoresist mask are removed. The exposed portions of the dielectric layer 15 may be removed by a selective etch process. For example, the composition of the etchant may be selected to remove the exposed portions of the dielectric layer 15 while not removing the etch mask or the underlying LTPS layer 10, in which the source/drain regions 25a. 25b having the first concentration dopant are present.

Figure 4:
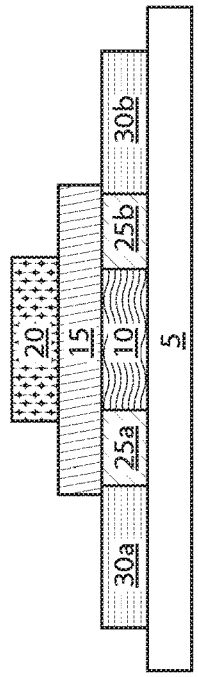
FIG. 4 is a side cross-sectional view depicting ion implanting a second concentration of dopant for the source and drain region, in which the dopant concentration of the second concentration is greater than the dopant concentration for the first concentration.

FIG. 4 depicts ion implanting a second concentration of dopant for the source and drain regions 30a. 30b, in which the dopant concentration of the second concentration is greater than the dopant concentration for the first concentration. The dielectric 15 may be used as an implant mask. Alternatively, the photoresist mask used for patterning layer 15 as described with reference to FIG. 3 may be used as an implant mask. The source and drain regions identified by reference numbers 30a and 30b may be referred to intermediately doped source and drain regions. The conductivity type, i.e., n-type or p-type conductivity type, for the source and drain regions having the second concentration of dopant 30a, 30b is the same as the conductivity type as the source and drain regions having the first concentration of dopant 25a, 25b. The ion implantation step for forming the source and drain regions 30a. 30b having the second concentration is similar to the above described ion implantation step for forming the source and drain regions 25a, 25b having the first concentration. Therefore, the above description of the ion implantation process for forming the source and drain regions having the first concentration of dopant is suitable for describing one embodiment of the ion implantation process for forming the source and drain regions 30a, 30b having the second concentration of dopant, in which the ion implantation process is modified to provide that the second concentration of dopant is greater than the first concentration of dopant. For example, the source and drain regions having the second concentration of dopant. e.g., n-type dopant, may be implanted to a total doping concentration ranging from $5 \times 10^{18}$ cm$^{-3}$ to $1 \times 10^{20}$ cm$^{-3}$. In some embodiments, the two implantation steps described with reference to FIG. 2 and FIG. 4 may be combined into a single implantation step. For example, with reference to FIG. 4, the channel region 10 of the LTPS layer 10 which is masked by both the gate electrode 20 and dielectric 15 may receive a negligible dose of implanted species, regions 25a, 25b which are masked only by dielectric 15 may receive a moderate dose of implanted species, and regions 30a, 30b which are not masked may receive a high dose of implanted species. In some embodiments, a photoresist mask may be used as an implant mask, instead of the electrode material 20. After implantation, the photoresist mask may be removed, followed by dopant activation and formation of the electrode material 20. Such a process sequence, allows use of electrode materials that do not withstand the dopant activation process, in one or more embodiments.

In this example, the source and drain region having the first concentration of dopant provides a lightly doped drain (LDD) (also referred to as a source and drain extension region), and the source and drain regions having the second concentration of dopant provides intermediately doped source and drain regions. These regions are both formed using ion implantation, and have dopant concentrations less than the subsequently described epitaxial source and drain regions 35a, 35b. Therefore, the source and drain region having the first concentration of dopant provides a lightly doped drain (LDD) (also referred to as a source and drain extension region), and the source and drain regions having the second concentration of dopant provides intermediately doped source and drain regions may be collectively referred to as a first concentration region; and the epitaxial source and drain regions 35a, 35b may be collectively referred to as a second concentration region.

Figure 5:
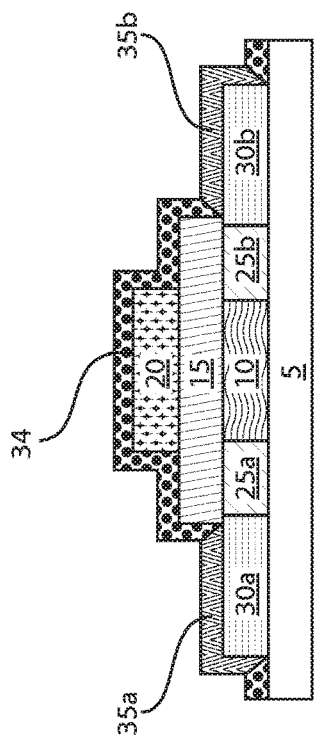
FIG. 5 is a side cross-sectional view depicting one step of a low temperature epitaxial deposition process for forming an in situ doped epitaxial semiconductor material on the source and drain regions of the TFT device, wherein a concentration of the dopant in the in situ doped epitaxial semiconductor material is greater than the concentration of dopant in the portions of the source and drain region that are formed using ion implantation, in accordance with one embodiment of the present disclosure.
Figure 6:
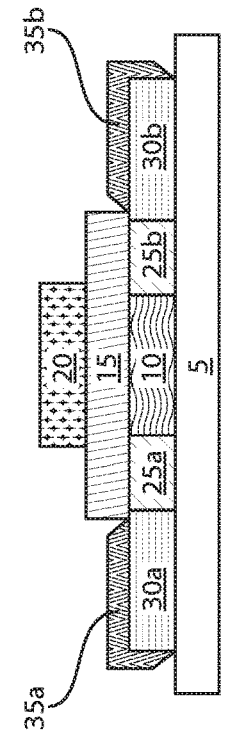
FIG. 6 is a side cross-sectional view depicting a second step of the low temperature epitaxial deposition process for forming the in situ doped epitaxial semiconductor material, in which amorphous semiconductor material that is formed on dielectric structures is removed selectively to epitaxial semiconductor material that is formed atop semiconductor material, in accordance with one embodiment of the present disclosure.

FIGS. 5 and 6 depict epitaxially formed doped regions 35a, 35b on the regions 30a, 30b of the LTPS layer 10 that are provided by ion implanting the LTPS layer 10. The concentration of the conductivity type dopant, e.g., n-type dopant, in the dopant regions that are epitaxially formed 35a, 35b is greater than a concentration of the conductivity type dopant in the dopant regions that are formed by ion implantation in the LTPS layer 10. The epitaxially formed source and drain regions 35a, 35b are formed using a low temperature epitaxial deposition process at a temperature less than 450° C. For example, the low-temperature epitaxial growth may be performed using PECVD at temperatures below 450° C. In other examples, the low temperature epitaxial growth process for forming the epitaxially formed source and drain regions 35a, 35b may be performed at growth temperatures ranging from 150° C. to 350° C. Other growth techniques such as hot-wire CVD (HWCVD) may also be used.

FIG. 5 depicts one step of a low temperature epitaxial deposition process for forming an in situ doped epitaxial semiconductor material on the source and drain regions 35a, 35b of the TFT device, wherein a concentration of the dopant in the in situ doped epitaxial semiconductor material 35a, 35b is greater than the concentration of dopant in the portions of the source and drain region 30a, 30b that are formed using ion implantation. In some embodiments, the semiconductor material for the in situ doped epitaxial semiconductor material 35a, 35b is hydrogenated Si (Si:H) that is blanket deposited. This results in crystalline (single or poly) growth for the epitaxial semiconductor material 35a, 35b on the exposed parts on the semiconductor substrate. e.g., LTPS layer 10, and in non-crystalline growth of material 34 elsewhere, i.e., on the dielectric layer 15. Non-crystalline Si:H typically includes hydrogenated amorphous silicon (a-Si:H) but it may also include hydrogenated nano/micro-crystalline silicon. Nano/micro-crystalline refers to an amorphous material that contains randomly distributed small crystalline or partially crystalline regions (known as crystallites) within the amorphous material.

The epitaxially formed source and drain regions 35a, 35b is composed of a crystalline hydrogenated silicon (c-Si:H). Epitaxial growth means the material grown on a substrate follows the crystalline structure of the substrate. For example, the crystalline material of the crystalline hydrogenated silicon (c-Si:H) has a polycrystalline structure if grown epitaxially on LTPS. In another example, the crystalline hydrogenated silicon (c-Si:H) has a single crystal crystalline structure (also referred to as monocrystalline silicon) if grown on a single-crystalline substrate, e.g. a silicon-on-insulator (SOI) wafer.

The Si:H material used for the epitaxial formation of source and drain regions 35a, 35b may be grown from a mixture of a precursor gas containing silane ($SiH_4$) (or other gases of the $Si_xH_y$ family), a carrier gas containing hydrogen ($H_2$) and a dopant gas. The ratios of the carrier gas and the precursor gas may be selected such that $[H_2]/[SiH_4]>5$. For n-type doping, the dopant gas may include phosphine ($PH_3$). For p-type doping, the dopant gas may include $B_2H_6$ or trimethylborane (TMB).

The c-Si:H for the epitaxial formed source and drain regions 35a, 35b may have a hydrogen (H) content in the range of 5 atomic percent to 40 atomic percent. The H content in c-Si:H may or may not be uniform. In some embodiments, the H content has an increasing gradient towards the interface of the c-Si:H for the epitaxial formed source and drain regions 35a, 35b and the silicon (Si) of the LTPS layer 10. In some embodiments, the c-Si:H of the epitaxial formed source and drain regions 35a, 35b may further contain one or more of the following elements: deuterium (D), fluorine (F), chlorine (Cl), carbon (C), germanium (Ge), oxygen (O), nitrogen (N) and combinations thereof. In some embodiments where c-Si:H contains germanium (Ge), e.g., c-SiGe:H films, the germanium (Ge) introduced from a gas source, such as germane ($GeH_4$), such that $[H_2]/([SiH_4]+[GeH_4])>5$. In some embodiments, Ge is added for p-type films and not for n-type films. The epitaxial formed source and drain regions 35a, 35b may have a total doping concentration, e.g., n-type dopant, in the epitaxial hydrogenated crystalline silicon (c-Si:H) material that ranges from $10^{20}$ $cm^{-3}$ to $10^{21}$ $cm^{-3}$. The epitaxial formed source and drain regions 35a, 35b may have an active doping concentration in the epitaxial hydrogenated crystalline silicon (c-Si:H) material that ranges from $10^{19}$ $cm^{-3}$ to $5\times10^{20}$ $cm^{-3}$. In one example, the epitaxial hydrogenated crystalline silicon (c-Si:H) is grown from a mixture of hydrogen ($H_2$) containing carrier gas, a silane ($SiH_4$) containing precursor gas, and a phosphine ($PH_3$) containing dopant gas, wherein the gas flow ratio of phosphine to silane $[PH_3]/[SiH_4]$ is greater than 1000 ppm. It is noted that the above description of the epitaxial source and drain region 35a, 35b only provides a summary type description of these regions and their formation.

In one embodiment, the selective epitaxial growth of silicon for the epitaxial source and drain regions 35a, 35b is performed in a hydrogen diluted silane environment using a plasma enhanced chemical vapor deposition process (PECVD). The gas ratio of hydrogen gas to silane gas ($[H_2]/[SiH_4]$) at 150° C. is preferably between 0 to about 1000. In particularly useful embodiments, epitaxially growth of silicon begins at a gas ratio of about 5-10. The epitaxial Si quality for the epitaxial source and drain regions 35a, 35b improved by increasing the hydrogen dilution, e.g., to 5 or greater. In another embodiment, the ratio of hydrogen to source gas that can be used ranges from 5:1 to 1000:1. For example, epitaxial growth of silicon is possible at temperatures as low as 150° C. with ratios of hydrogen to silane ($SiH_4$) ranging from 5:1 to 20:1.

Epitaxial silicon for the epitaxial source and drain regions 35a, 35b can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) can be performed for forming the epitaxial source and drain regions 35a, 35b at deposition temperature ranges from about room temperature (e.g., 20° C. to 25° C.) to about 500° C. In another embodiment, the deposition temperature for forming the epitaxial source and drain regions 35a, 35b ranges from about 150° C. to about 250° C. Plasma power density may range from about 2 $mW/cm^2$ to about 2000 $mW/cm^2$. In other examples, the power density for the PECVD process for epitaxially growing the epitaxially formed source and drain regions 35a. 35b may range from 2 $mW/cm^2$ to 100 $mW/cm^2$, and in one example may be in the range of 3 $mW/cm^2$ to 10 $mW/cm^2$. The deposition pressure range may be from about 10 mtorr to about 5 torr. In one embodiment of the present disclosure, the pressure for the PECVD process that can be used for epitaxially growing the epitaxial source and drain regions 35a, 35b can range from 10 mTorr to 5 Torr, and in one example may be in the range of 250 mtorr to 900 mTorr.

The thickness of the epitaxial source and drain regions 35a, 35b, as well as the non-epitaxial material 34, may range from 2 nm to 100 nm. In another embodiment, the thickness of the epitaxial source and drain regions 35a, 35b ranges from 5 nm to 15 nm.

The PECVD device can employ a parallel plate chamber configuration. In other embodiments, a hot-wire chemical vapor deposition process can be used in forming the epitaxial source and drain regions 35a, 35b.

The dopant, i.e., n-type or p-type dopant is incorporated into the epitaxial source and drain regions 35a, 35b using in situ doping. By "in-situ" it is meant that the dopant that dictates the conductivity type of the epitaxial source and drain regions 35a, 35b is introduced during the process step, e.g., epitaxial deposition, that forms the epitaxial source and drain regions 35a, 35b. During epitaxial deposition in situ doping includes introduction of the n-type or p-type dopants through dopant gases during the epitaxial growth process. When a doped semiconductor material layer of an n-type conductivity is to be formed, e.g., n-type epitaxial source and drain regions 35a, 35b, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%.

When a doped semiconductor material of a p-type conductivity is to be formed, e.g., p-type epitaxial source and drain regions 35a, 35b, a dopant gas including at least one p-type dopant, e.g., B, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane (SiH$_4$) ranging from 0.1% to 10%.

It is noted that the above examples are provided for illustrative purposes only, and are not intended to limit the described methods and structures to only these examples.

FIG. 5 further depicts that in addition to the crystalline material of the epitaxial source and drain regions 35a, 35b that is formed on the semiconductor material ion implanted source and drain regions 30a, 30b of the LTPS layer 10, a non-crystalline material 34 may be formed on non-semiconductor surfaces, such as the dielectric layer 15 and the electrode material 20. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. Therefore, in places in which the epitaxial material for the epitaxial source and drain regions 35a, 35b is grown on exposed surfaces of the semiconductor LTPS layer 10, a doped crystalline semiconductor material layer is formed providing the epitaxial source and drain regions 35a, 35b, while in other places in which the doped semiconductor material layer is grown a non-crystalline material, such as the dielectric layer 15, and the electrode material 20, a doped non-crystalline semiconductor material layer portion 34 is formed. The non-crystalline semiconductor material layer portion 34 may be referred to as having an amorphous crystalline structure.

FIG. 6 depicts a second step of the low temperature epitaxial deposition process for forming the in situ doped epitaxial semiconductor material for the epitaxial source and drain regions 35a, 35b, in which amorphous semiconductor material 34 that is formed on dielectric structures is removed selectively to epitaxial semiconductor material 35a, 35b that is formed atop semiconductor material. More specifically, in some embodiments, the non-crystalline portion of Si:H (identified by reference number 34) is removed selectively using an appropriate dry or wet etch. The etch process is selective to the crystalline portions of the hydrogenated silicon (c-Si:H) that provides the epitaxial source and drain regions 35a, 35b.

In one example, etching is performed in-situ using a H$_2$ plasma. In some embodiments, the hydrogen plasma etch that can be used to remove the non-crystalline (amorphous) silicon material 34 selective to the crystalline portions of the hydrogenated silicon (c-Si:H) that provides the epitaxial source and drain regions 35a, 35b can be performed in the same reactor chamber as used to form the doped semiconductor material layer without breaking the vacuum of the chamber; such an etch may be referred to herein as an in-situ hydrogen plasma etch. In other embodiments, the hydrogen plasma etch can be performed in a different reactor chamber as that used to form the doped semiconductor material layer.

The hydrogen plasma etch that can be performed at a temperature of from room temperature (20° C.) to 500° C. and at a hydrogen pressure from 10 mtorr to 5 torr. In some embodiments, the hydrogen plasma etch is performed at a temperature of from 100° C. to 250° C. and at a hydrogen pressure from 10 mtorr to 1 torr. The hydrogen plasma etch can be performed utilizing one of hydrogen or HCl as a source of the hydrogen plasma. In some embodiments, the etch selectivity for removing the non-crystalline/amorphous semiconductor material layer portions 34 relative to the material for the crystalline epitaxial source and drain regions 35a, 35b is from 2:1 to 10:1. In some embodiments, the removal of the non-crystalline/amorphous semiconductor material layer portions 34 relative to the material for the crystalline epitaxial source and drain regions 35a, 35b can be performed using other types of plasmas besides hydrogen plasma including, for example, Cl$_2$ or Ar.

In this embodiment of the present disclosure and as shown in FIG. 6, the remaining doped crystalline semiconductor material layer following the aforementioned etch method provides the epitaxial source and drain regions 35a, 35b of the thin film transistor.

Further details regarding the epitaxial growth process and the selective etch process for forming the epitaxial source and drain regions 35a, 35b of the present disclosure are described in U.S. Patent Publication No. 2012/0210932, which is owned by the assignee of the present disclosure, and is incorporated herein by reference.

Figure 7:
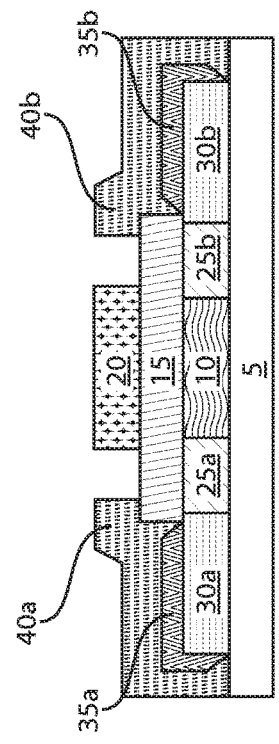
FIG. 7 is a side cross-sectional view depicting forming contacts to the in situ doped epitaxial semiconductor material of the source and drain regions of the TFT device, in accordance with one embodiment of the present disclosure.

FIG. 7 depicts one embodiment of forming contacts 40a, 40b to the in situ doped epitaxial semiconductor material of the source and drain regions 35a, 35b of the TFT device. In some embodiments, the contacts 40a. 40b may include self-aligned silicide that is formed on the epitaxial source and drain regions 35a, 35b. The self-aligned silicide may be formed by a process that includes (i) blanket metal deposition, (ii) chemical reaction between metal and c-Si:H, and (iii) selective removal of unreacted (unsilicided) portion of metal with respect to silicide, which removes metal from everywhere else except the silicided portion on c-Si:H, as illustrated in the final structure depicted in FIG. 7. In some embodiments, step (ii) is facilitated by post-deposition annealing. In some embodiments, step (ii) is facilitated by using a substrate temperature above room temperature during metal deposition. In some embodiments, no heating or annealing is used. In some embodiments, step (iii) is facilitated by the poor adhesion of metal to dielectrics. In one example, annealing is performed in the range of 100-200° C. for 5-15 minutes. Metals used for silicide formation may include, but are not limited to Cr, Ni and Ti.

Reference is now made to FIGS. 8-14 which illustrate yet another embodiment of the present disclosure. This embodiment of the present disclosure is similar to the embodiment depicted in FIGS. 1-7, except that after forming the gate structure 45, 50 on the channel portion of the LTPS layer 10, a dielectric spacer 51 is formed on exposed sidewalls of the gate structure 45, 50.

Figure 8:
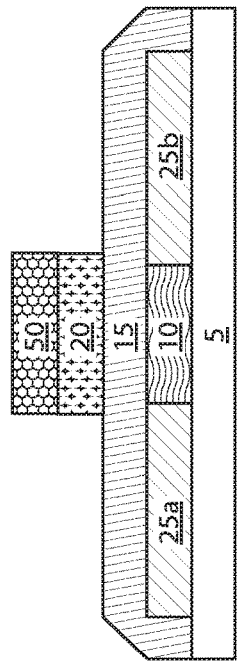
FIG. 8 is a side cross-sectional view depicting another embodiment of an initial structure for forming a thin film transistor (TFT) that includes a low temperature polysilicon semiconductor (LTPS) layer on a dielectric substrate, a dielectric layer overlying the LTPS layer, and a gate structure including a gate dielectric and a gate conductor overlying a channel region portions of the LTPS layer, in accordance with one embodiment of the present disclosure.

FIG. 8 depicts another embodiment of an initial structure for forming a thin film transistor (TFT) that includes a low temperature polysilicon semiconductor (LTPS) layer 10 on an insulating substrate 5, a dielectric layer 15 overlying the LTPS layer 10, and a gate structure including a gate dielectric cap 50, a gate conductor 45, and a gate dielectric 15 overlying a channel region portion of the LTPS layer 10.

The structures identified by reference numbers 5, 10, and 15 that are depicted in FIG. 8 have been described above with reference to FIG. 1. Therefore, the description of the structures identified by reference numbers 5, 10 and 15 in FIG. 1, is suitable for describing these same structures having these same reference numbers in FIG. 8, as well as their methods of formation. The gate conductor 45 may be composed of an electrically conductive material, such as a metal and/or doped semiconductor, such as n-type doped polysilicon. The gate dielectric cap 50 may be composed of an oxide, nitride or oxynitride material. For example, the gate dielectric cap 50 may be composed of silicon nitride and/or silicon oxide. The gate dielectric cap 50 and the gate conductor 45 may be patterned using photolithography and etch process steps.

Figure 9:
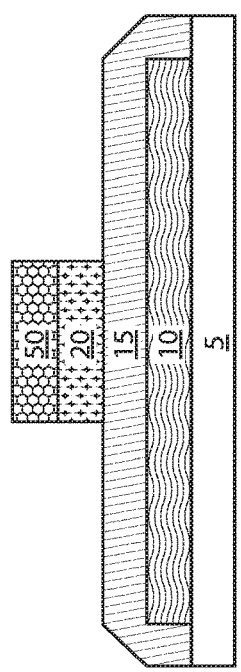
FIG. 9 is a side cross-sectional view depicting forming source and drain regions having a first concentration on opposing sides of the channel region of the LTPS layer depicted in FIG. 8 using ion implantation, in accordance with one embodiment of the present disclosure.

FIG. 9 forming source and drain regions 25a, 25b having a first concentration on opposing sides of the channel region of the LTPS layer 10 that is depicted in FIG. 8 using ion implantation. The source and drain regions 25a, 25b having the first concentration have been described above with reference to FIG. 2.

Figure 10:
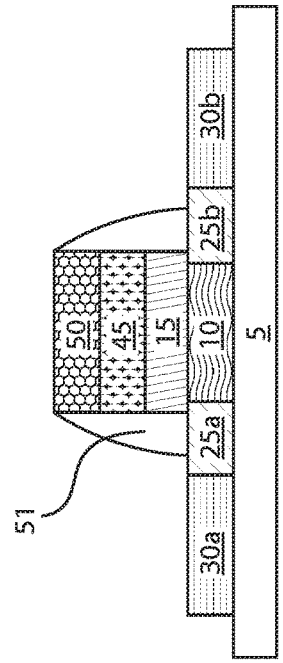
FIG. 10 is a side cross-sectional view depicting forming a spacer on the gate structure depicted in FIG. 9.

FIG. 10 depicts forming a spacer 51 on the gate structure 15, 45, 50 depicted in FIG. 9. Forming the spacer 51 may begin with etching the portions of the dielectric layer 15 that not covered by the gate conductor 45 and the gate dielectric cap 50. Following removal of the exposed portions of the dielectric layer 15, the spacer 51 may be formed on the sidewall portions of the remaining dielectric layer 15, i.e., gate dielectric, the gate conductor 45 and the gate dielectric cap 50.

In one embodiment, the spacer 51 can be formed using a conformal deposition process in combination with an anisotropic (directional) etch process. The material for the spacer 51 can be formed by any conformal deposition process, such as chemical vapor deposition (CVD), e.g., plasma enhanced chemical vapor deposition (PECVD) and atomic layer deposition (ALD). The etch process used in the formation of the spacer 51 can be an anisotropic etch, such as reactive ion etching (RIE). In some embodiments, a portion of the spacer, e.g. an etch-stop bottom portion of the spacer which has a different composition than the top portion of the spacer, may be removed by an isotropic etch, such as a wet chemical etch.

Figure 11:
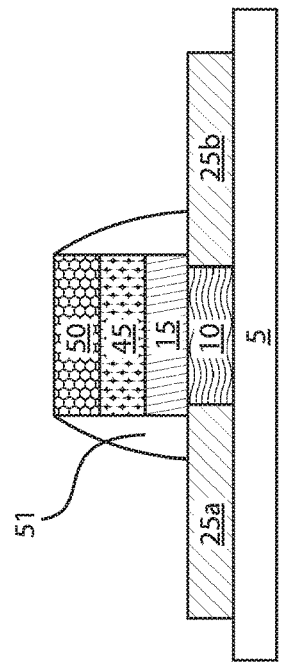
FIG. 11 is a side cross-sectional view depicting ion implanting a second concentration of dopant for the source and drain region, in which the dopant concentration of the second concentration is greater than the dopant concentration for the first concentration.

FIG. 11 depicts ion implanting a second concentration of dopant 30a, 30b for the source and drain region. The width of the spacers 51 helps to dictate the positioning of the second concentration of dopant 30a. 30b. The second concentration of dopant 30a, 30b for the source and drain regions have been described above with reference to FIG. 4. Therefore, the description of the structures identified by reference numbers 30a, 30b in FIG. 4, are suitable for describing these same structures having these same reference numbers in FIG. 11. For example, the dopant concentration of the source and drain regions 30a. 30b of the second concentration is greater than the dopant concentration for the source and drain regions 25a, 25b of the first concentration.

FIG. 12 depicts one step of a low temperature epitaxial deposition process for forming an in situ doped epitaxial semiconductor material 35a, 35b on the source and drain regions 30a. 30b of the TFT device depicted in FIG. 11. The first step of the low temperature epitaxial deposition process for forming the in situ doped epitaxial semiconductor material 35a, 35b has been described above with reference to FIG. 5. Therefore, the description of the epitaxial source and drain regions 35a, 35b, as well as the low temperature epitaxial deposition process that is described above with reference to FIG. 5, are suitable for describing these same structures having these same reference numbers and the low temperature epitaxial deposition process used in forming these structures that are depicted in FIG. 12. For example, the concentration of the dopant in the in situ doped epitaxial semiconductor material is greater than the concentration of dopant in the portions of the source and drain region that are formed using ion implantation. Further, the low temperature epitaxial process that forms the crystalline epitaxial source and drain regions 35a, 35b can also form a non-crystalline (amorphous) semiconductor material 34 on non-semiconducting surfaces, such as the dielectric surfaces of the spacer 51 and the gate dielectric cap 50.

FIG. 13 depicts a second step of the low temperature epitaxial deposition process for forming the in situ doped epitaxial semiconductor material 35a, 35b applied to the structure depicted in FIG. 12, in which amorphous semiconductor material 34 that is formed on dielectric structures, e.g., the spacer 51 and gate dielectric cap 50, is removed selectively to epitaxial semiconductor material 35a, 35b that is formed atop semiconductor material, i.e., the doped regions 30a. 30b of the LTPS layer 10. The second step of the low temperature epitaxial deposition process for forming the in situ doped epitaxial semiconductor material 35a, 35b has been described above with reference to FIG. 6. Therefore, the description of the etch process employing the hydrogen plasma for removing the amorphous semiconductor material 34 that is described above with reference to FIG. 6, is suitable for describing the same etch process for removing the amorphous semiconductor material 34 selectively to the epitaxial source and drain regions 35a, 35b that are depicted in FIG. 13.

FIG. 14 depicts forming contacts 40a, 40b to the in situ doped epitaxial semiconductor material 35a, 35b of the source and drain regions of the TFT device depicted in FIG. 13. The contacts 40a, 40b depicted in FIG. 14 are similar to the contacts 40 that are depicted in FIG. 7. Therefore, the description of the contacts 40a. 40b depicted in FIG. 7 is suitable for describing one embodiment of the contacts 40a, 40b that are depicted in FIG. 14. For example, the contacts 40a, 40b may include self-aligned silicides that have been described above with reference to FIG. 7.

It is noted that the dimensions in FIGS. 1-14 are not to scale. For example, the tapered edges of n+ c-Si:H for the epitaxial source and drain regions 35a, 35b are illustrative. In some other embodiments, the edges also may be rounded, have other shapes or are not tapered.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A. B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of thin film transistors (TFTs) with epitaxial source/drain contact regions (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:
1. A thin-film transistor (TFT) comprising:
   a polycrystalline semiconductor region present on an insulating substrate,
   a first concentration doped source/drain region formed within the semiconductor region on opposing sides of a channel region within the semiconductor region; and epitaxial hydrogenated crystalline silicon (c-Si:H) source/drain regions having a second concentration dopant present on the first concentration doped source/drain region, wherein the second concentration dopant of the epitaxial hydrogenated crystalline silicon (c-Si:H) source/drain regions is greater than a concentration of the first concentration doped source/drain region.

2. The TFT of claim 1, wherein the polycrystalline semiconductor region is comprised of low-temperature polysilicon (LTPS).

3. The TFT of claim 1, wherein a thickness of the semiconductor region is no greater than 100 nm.

4. The TFT of claim 1, further comprises an intermediately doped source/drain region between the first concentration doped source/drain regions and the epitaxial hydrogenated crystalline silicon (c-Si:H) source/drain regions having the second concentration dopant.

5. The TFT of claim 1, wherein the c-Si:H containing material contains 5 atomic percent hydrogen to 40 atomic percent hydrogen.

6. The TFT of claim 1, wherein a total doping concentration of the epitaxial hydrogenated crystalline silicon (c-Si:H) source/drain regions having the second concentration dopant ranges from $10^{20}$ cm$^{-3}$ to $10^{21}$ cm$^{-3}$.

7. The TFT of claim 6, wherein an active doping concentration of the epitaxial hydrogenated crystalline silicon (c-Si:H) source/drain regions having the second concentration dopant ranges from $10^{19}$ cm$^{-3}$ to $5\times10^{20}$ cm$^{-3}$.

8. The TFT of claim 1, wherein a total doping concentration of the first concentration doped source/drain region ranges from $5\times10^{117}$ cm$^{-3}$ to $10^{19}$ cm$^{-3}$.

9. The TFT of claim 3, wherein the intermediately doped source/drain region has a total doping concentration ranging from $5\times10^{18}$ cm$^{-3}$ to $10^{20}$ cm$^{-3}$.

10. A thin-film transistor (TFT) comprising:
   a polycrystalline semiconductor region present on an insulating substrate having a thickness of 100 nm or less;
   a first concentration doped source/drain region formed within the semiconductor region on opposing sides of a channel region within the semiconductor region;
   epitaxial hydrogenated crystalline silicon (c-Si:H) source/drain regions having a second concentration dopant present on the first concentration doped source/drain region, wherein the second concentration dopant of the epitaxial hydrogenated crystalline silicon (c-Si:H) source/drain regions is greater than a concentration of the first concentration doped source/drain region; and
   a gate structure present on the channel portion of the semiconductor region.

11. The TFT of claim 10, wherein the polycrystalline semiconductor region is comprised of low-temperature polysilicon (LTPS).

12. The TFT of claim 10, further comprising spacers present on sidewalls of the gate structure.

13. A method of forming a TFT thin-film transistor (TFT) comprising:
   forming a low temperature polysilicon semiconductor layer on a substrate;
   implanting first dopant regions on opposing sides of a channel region of the low temperature polysilicon semiconductor layer; and
   epitaxially forming second dopant regions on the first dopant regions, wherein a concentration of the conductivity type dopant in the second dopant regions is greater than a concentration of the conductivity type dopant in the first dopant regions.

14. The method of claim 13, wherein the second dopant regions comprise epitaxial hydrogenated crystalline silicon (c-Si:H).

15. The method of claim 14, wherein a thickness of the low temperature polysilicon semiconductor layer is no greater than 100 nm.

16. The method of claim 14, wherein a second total doping concentration of the epitaxial hydrogenated crystalline silicon (c-Si:H) ranges from $10^{20}$ cm$^{-3}$ to $10^{21}$ cm$^{-3}$, and an active doping concentration of the first dopant regions ranges $10^{19}$ cm$^{-3}$ to $5\times10^{2}$ cm$^{-3}$.

17. The method of claim 14, wherein the epitaxial hydrogenated crystalline silicon (c-Si:H) is grown from a mixture of hydrogen ($H_2$) containing carrier gas, a silane ($SiH_4$) containing precursor gas, wherein the gas flow ratio $[H_2]/[SiH_4]>5$.

18. The method of claim 17, wherein the epitaxial hydrogenated crystalline silicon (c-Si:H) is in situ doped with an n-type or p-type dopant.

19. The method of claim 18, wherein the epitaxial hydrogenated crystalline silicon (c-Si:H) is grown from a mixture of hydrogen ($H_2$) containing carrier gas, a silane ($SiH_4$) containing precursor gas, and a phosphine ($PH_3$) containing dopant gas, wherein the gas flow ratio of phosphine to silane $[PH_3]/[SiH_4]$ is greater than 1000 ppm.

20. The method of claim 13, wherein the epitaxial hydrogenated crystalline silicon (c-Si:H) is grown by plasma enhanced chemical vapor deposition (PECVD) at a growth temperature of 150-350° C.

* * * * *